United States Patent
Einaudi et al.

(10) Patent No.: US 10,204,511 B2
(45) Date of Patent: Feb. 12, 2019

(54) REMOTE CONTROL DEVICE USAGE DETECTION BASED ON POWER CONSUMPTION

(71) Applicant: Caavo Inc, Santa Clara, CA (US)

(72) Inventors: Andrew E. Einaudi, San Francisco, CA (US); Nino V. Marino, Alameda, CA (US); Pankaj Ramesh Chandra Katiyar, Nagpur (IN); Ashish D. Aggarwal, Stevenson Ranch, CA (US)

(73) Assignee: Caavo Inc, Milpitas, CA (US)

(*) Notice: Subject to any disclaimer, the term of this patent is extended or adjusted under 35 U.S.C. 154(b) by 0 days.

(21) Appl. No.: 15/476,776

(22) Filed: Mar. 31, 2017

(65) Prior Publication Data

US 2017/0287323 A1 Oct. 5, 2017

Related U.S. Application Data (60) Provisional application No. 62/317,153, filed on Apr. 1, 2016.

(51) Int. Cl.
*H02J 7/00* (2006.01)
*G01R 31/36* (2006.01)
*G08C 17/02* (2006.01)

(52) U.S. Cl.
CPC ......... *G08C 17/02* (2013.01); *G01R 31/3606* (2013.01); *G01R 31/3648* (2013.01); *H02J 7/0004* (2013.01); *H02J 7/0047* (2013.01); *G08C 2201/12* (2013.01)

(58) Field of Classification Search
CPC ............ G01R 31/3606; G01R 31/3648; G01R 31/3658; G01R 31/3689; H02J 7/0047; H02J 7/0016; H02J 7/0004; H02J 7/0021; H02J 2007/0001; H04Q 9/00; H04Q 2209/826; H04Q 2209/40; H01M 10/482; B60L 11/1861; G08C 17/02; G08C 2201/12

See application file for complete search history.

(56) References Cited

U.S. PATENT DOCUMENTS

| | | | | |
|---|---|---|---|---|
| 5,606,242 A | * | 2/1997 | Hull | H02J 7/0004 320/106 |
| 5,926,006 A | * | 7/1999 | Burroughs | H02J 7/0004 320/114 |
| 5,955,869 A | * | 9/1999 | Rathmann | G01R 31/3648 320/132 |
| 5,973,475 A | * | 10/1999 | Combaluzier | H01M 10/4221 320/107 |
| 6,084,523 A | * | 7/2000 | Gelnovatch | G01R 31/3648 320/137 |
| 7,598,880 B2 | * | 10/2009 | Powell | G01R 31/3606 340/635 |
| 7,805,263 B2 | * | 9/2010 | Mack | A61N 1/3708 320/132 |

(Continued)

*Primary Examiner* — Brian E Miller
(74) *Attorney, Agent, or Firm* — Fiala & Weaver P.L.L.C.

(57) ABSTRACT

Methods, systems, and apparatuses are described for remote control device usage detection. A smart battery may be inserted into a remote control device. The smart battery provides power to the remote control device as well as monitors the power consumption when a particular one or more interface elements of the remote control is interacted with by an end user. The power consumption information is transmitted to a receiver, which may identify the remote control device and/or the interface element(s) that has been interacted with based on the received data.

12 Claims, 6 Drawing Sheets

(56) References Cited

U.S. PATENT DOCUMENTS

| | | | | |
|---|---|---|---|---|
| 8,497,660 | B2* | 7/2013 | Soong | G07F 15/005 |
| | | | | 320/106 |
| 8,768,549 | B2* | 7/2014 | Erko | B60W 10/26 |
| | | | | 320/135 |
| 9,146,595 | B2* | 9/2015 | Forutanpour | G01R 31/3606 |
| 9,178,570 | B2* | 11/2015 | Deluca | H04B 5/0043 |
| 9,285,430 | B2* | 3/2016 | Loftus | G01R 31/3606 |
| 9,459,938 | B1* | 10/2016 | Denton | G06F 17/18 |
| 9,709,607 | B2* | 7/2017 | Tan | G01R 19/16542 |
| 2009/0037040 | A1* | 2/2009 | Salmon | B63B 17/00 |
| | | | | 701/21 |
| 2012/0306655 | A1* | 12/2012 | Tan | G01R 31/3651 |
| | | | | 340/636.1 |
| 2013/0176243 | A1* | 7/2013 | BianRosa | G06F 3/017 |
| | | | | 345/173 |
| 2014/0169795 | A1* | 6/2014 | Clough | G06F 19/3418 |
| | | | | 398/106 |
| 2014/0312848 | A1* | 10/2014 | Alexander | H02J 7/0013 |
| | | | | 320/134 |
| 2015/0149366 | A1* | 5/2015 | Schafer | H04N 21/42207 |
| | | | | 705/304 |
| 2015/0326982 | A1* | 11/2015 | Sudan | H04R 25/305 |
| | | | | 381/323 |
| 2016/0023675 | A1* | 1/2016 | Hannah | B60L 11/1846 |
| | | | | 701/2 |
| 2016/0046199 | A1* | 2/2016 | Butler | B60L 11/1846 |
| | | | | 320/106 |
| 2017/0059660 | A1* | 3/2017 | Morsillo | G01R 31/3606 |
| 2017/0244270 | A1* | 8/2017 | Waters | B60L 11/1829 |
| 2018/0010919 | A1* | 1/2018 | Huang | G01C 21/3469 |

* cited by examiner

REMOTE CONTROL DEVICE USAGE DETECTION BASED ON POWER CONSUMPTION

CROSS-REFERENCE TO RELATED APPLICATIONS

This application claims priority to U.S. Provisional Patent Application No. 62/317,153, filed Apr. 1, 2016 and entitled "Remote Control Device Usage Detection Based on Power Consumption," the entirety of which is incorporate by reference herein.

BACKGROUND

Technical Field

The subject matter described herein relates to remote control device usage detection.

Description of Related Art

Consumer electronic devices are often controlled using infrared (IR) or radio-frequency (RF)-based remote control devices (also referred to as "remote controls" or "remotes"). Typically, only the consumer electronic device being controlled by a particular remote control device is capable of detecting that the remote control device is being used by an end user. For example, when a user uses a "Roku®" remote, only the Roku® device detects the interaction and responds to it. However, it is desirable in some circumstances for other devices to determine whether an end user is using a particular remote control. One known method for an IR remote is to use an IR receiver that observes the IR signals coming out of the remote. Each IR remote emits a particular pattern of IR pulses when a key is pressed. By knowing this pattern a priori, the IR receiver can determine which remote control, and in many cases, which key was pressed.

However, this scheme does not work for RF remote controls because these remote controls are typically "paired" with a particular consumer electronic device, and in this case it is difficult to determine what RF signals any remote control is sending. This is due to various reasons such as the very high frequencies at which these RF signals are transmitted, as well as encryption schemes used by these devices.

BRIEF SUMMARY

Methods, systems, and apparatuses are described for detecting remote control device usage, substantially as shown and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further explain the principles of the embodiments and to enable a person skilled in the pertinent art to make and use the embodiments.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

II. Example Embodiments

Embodiments described herein are directed to usage detection of a remote control device. In accordance with an embodiment, a "smart" battery that is inserted into the remote control device is configured to monitor its power consumption when a particular one or more interface elements of the remote control are interacted with by an end user. The smart battery is different from a typical battery in that it is configured to transmit information to a receiving device or a receiver that enables the receiving device to identify the remote control device and/or the interface element(s) thereof that were interacted with. In accordance an embodiment, the smart battery includes a resistor as a sensing device that enables the detection of power consumption to determine usage of the remote control device. In accordance with another embodiment, the smart battery includes a magnetic sensor as a sensing device that enables the detection of power consumption to determine usage of the remote control device.

In accordance with an example embodiment, the receiving device is configured to receive the information transmitted by the remote control device and to identify the remote control device that has been interacted with based on the received data. Additionally, the receiving device may identify a particular interface element of the remote control device that has been interacted with based on the received data. The receiving device may include a memory that stores one or more profiles and/or may obtain data from one or more sources (e.g., cloud storages, servers). Such data may be used to modify, delete or add to the one or more profiles. The profiles may be power profiles for a plurality of different remote control devices and/or interface elements for each of the different remote control devices. The receiving device is configured to compare the information transmitted by the remote control device to the profiles to perform the identification.

In accordance with one or more embodiments, upon identifying the remote control device being used, a switching device (e.g., an audio/video receiver) to which a plurality of consumer electronic devices are coupled may automatically activate (e.g., switch to) an input port to which the consumer electronic device associated with the identified remote control device is coupled.

In accordance with an embodiment in which the remote control device is a universal remote control device, upon identifying the interface element of the universal remote control device that has been interacted with, the universal remote control device is automatically placed into a mode that enables the universal remote control device to communicate with a consumer electronic device associated with the identified interface element.

A. System for Detecting Usage of a Remote Control Device

Figure 1:
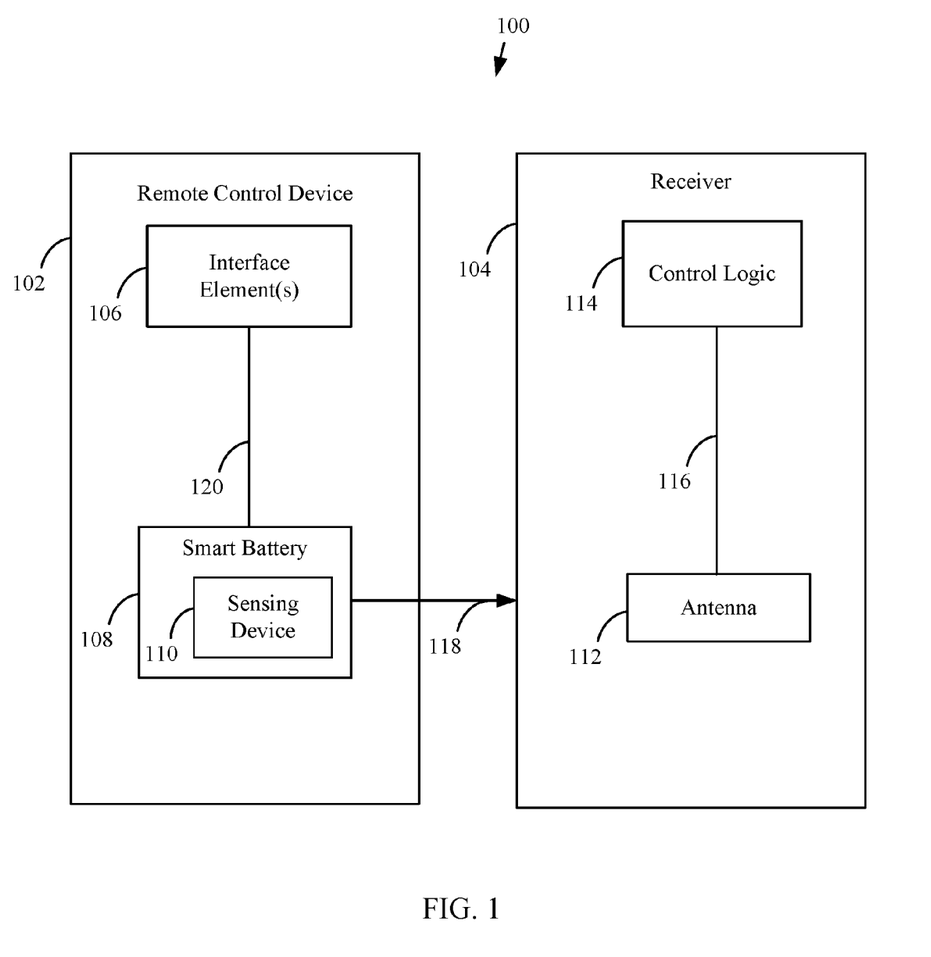
FIG. 1 is a block diagram of a system for detecting usage of a remote control device in accordance with an example embodiment.

FIG. 1 is a block diagram of a system 100 for detecting usage of a remote control device in accordance with an embodiment. As shown in FIG. 1, system 100 includes a remote control device 102 and a receiver 104. Remote control device 102 may be used to control a consumer electronic device, such as a DVD player, a TV, a set-top box (a cable TV set-top box, a satellite TV set-top box, etc.), a video game console, an audio/video receiver, a Blu-Ray™ player, etc. Remote control device 102 may be configured to transmit signals, which may be IR-based or RF-based signals. Examples of RF-based signals include, but are not limited to, Bluetooth™ signals, as described in the various standards developed and licensed by the Bluetooth™ Special Interest Group, ZigBee® or ZigBee® RF4CE signals (Radio Frequency for Consumer Electronics), which are based on the IEEE 802.15.4 standards for wireless personal area networks, near field communication (NFC) signals, other RF-based signals such as signals transmitted in accordance with any of the well-known IEEE 802.11 protocols and the like. Examples of IR-based signals may be digital (binary) data transmitted using infrared light. IR-based signals may be modulated (e.g., via a 38 kHz modulation scheme) and may be encoded (e.g., downtime encoding, alternating encoding, uptime encoding, etc.). Examples of remote control device 102 include a dedicated or universal remote control device, a laptop, a tablet, a telephone (e.g., a smart phone and/or a mobile phone) and the like.

As further shown in FIG. 1, remote control device 102 includes one or more interface elements 106 and a smart battery 108. Each of interface elements 106 may be configured to perform many functions when activated. Such functions may include, but are not limited to, selecting a consumer electronic device that an end user would like to control, enabling a user to enter a channel that the user would like to watch, enabling a user to control the volume of a consumer electronic device, enabling a user to activate and/or control a menu associated with a consumer electronic device, etc. Interface elements 106 may be physical interface elements (e.g., buttons, sliders, jog shuttles, etc.) or virtual interface elements (e.g., icons, buttons, etc.) displayed via a capacitive touch display screen. Each of interface elements 106, when interacted with by a user, causes a certain amount of power to be consumed from smart battery 108 via connection 120. This amount of power consumed is greater than the amount of power consumed when remote control device 102 is in an idle state, that is, when remote control device 102 is not being used by the user. Smart battery 108 may include a sensing device 110 that is configured to detect a variation in current flow of smart battery 108. The variation in current flow may be used to determine power consumption at remote control device 102 or may be processed and/or sent as information 118 to receiver 104 for further analysis. Smart battery 108 may be inserted in remote control device 102. Furthermore, smart battery 108 may be paired with remote control device 102 such that receiver 104 may identify remote control device 102 by a unique identifier (ID) associated with smart battery 108. Smart battery 108 may be implemented in various manners, some of which are further described below in conjunction with FIGS. 3 and 4.

As shown in FIG. 1, receiver 104 includes antenna 112 that is coupled with control logic 114 via connection 116. Receiver 104 is configured to wirelessly receive information 118 transmitted by remote control device 102 via antenna 112. Control logic 114 is configured to identify a remote control device that has been interacted with based on information 118 received from remote control device 102. Additionally, control logic 114 may further identify the interface element(s) that have been interacted with based on information 118. Control logic 114 may be implemented in hardware (e.g., digital and/or analog circuits) or hardware and software (e.g., software or firmware running on a processor circuit or other hardware). Receiver 104 may be integrated in another device, for example, an audio/video receiver, a switching device, another remote control device, or a device that may be used as a remote control for a consumer electronic device.

In an embodiment, receiver 104 is a component of a switching device. Such a switching device may include a plurality of audio/video (AV) ports and a switch circuit that is operable to selectively connect any one of a plurality of source devices, each of which is connected to a corresponding one of the plurality of AV ports, to a sink device that is connected to another one of the plurality of AV. Consumer electronic devices that are configured to provide audio and/or video signals for playback are "source" devices, such as a Blu-ray player, a set-top box, or a streaming media device (e.g., Roku™ AppleTV™, Chromecast™). Consumer electronic devices that are configured to receive audio and/or video signals are "sink" devices, such as a television (TV), or a sound system. AV ports may be (but are by no means limited to) high definition media interface (HDMI) ports, in which case, the switching device may be referred to as an HDMI switch. The switching device is configured to switch between different AV source devices and provide an output signal from the selected AV source device. To provide automatic and seamless switching and/or control, the switching device, via receiver 104, may obtain information associated with the various connected consumer electronic devices to provide an enhanced and frustration-free experience to the end user. For example, when the end user uses a proprietary remote control (e.g., Roku™) to turn on a TV, receiver 104 may detect the usage of the proprietary remote control via the smart battery inserted in that proprietary remote control using the techniques described herein. In this manner, the usage of the proprietary remote control may be detected without having to identify and analyze IR signals and/or RF signals from the proprietary remote control.

The techniques described herein are advantageous at least because the various states of the consumer electronic devices may be determined simply by knowing which remote control and/or interface element of a remote control was interacted with by the end user. Furthermore, the various states of consumer electronic devices may also be monitored by receiver 104 to determine whether the states have been changed and whether any action needs to be performed in response the change in state. In addition, receiver 104 may also effect a change in the states of the consumer electronic devices. In other words, the switching device may facilitate control operations (e.g., play, pause, stop) and/or change settings (e.g., volume control, brightness control) of the connected electronic devices based on their states. For example, if the end user powers off a game console connected to the switching device, the next time the user presses a button on the remote control of the game console, the switching device would know that the game console is powered off and needs to be powered back on. Based on this information, the switching device may cause the game console to be powered on in response to detecting usage of the remote control of the game console. Remote control usage information and/or state information of the electronic devices may also be used to facilitate the switching from one source device to another in a seamless manner, for example, connecting the AV port corresponding to the selected source device to the desired sink device or turning on the selected source device while turning off another source device.

Furthermore, by identifying a remote control device and/or an interface element thereof that has been interacted with, it is possible to automatically place the identified remote control device or a different remote control device (such as a universal remote control) into a particular mode that enables either remote control device to communicate with the associated consumer electronic device corresponding to either remote control device.

B. Smart Battery Having a Resistor as a Sensing Device

Figure 2:
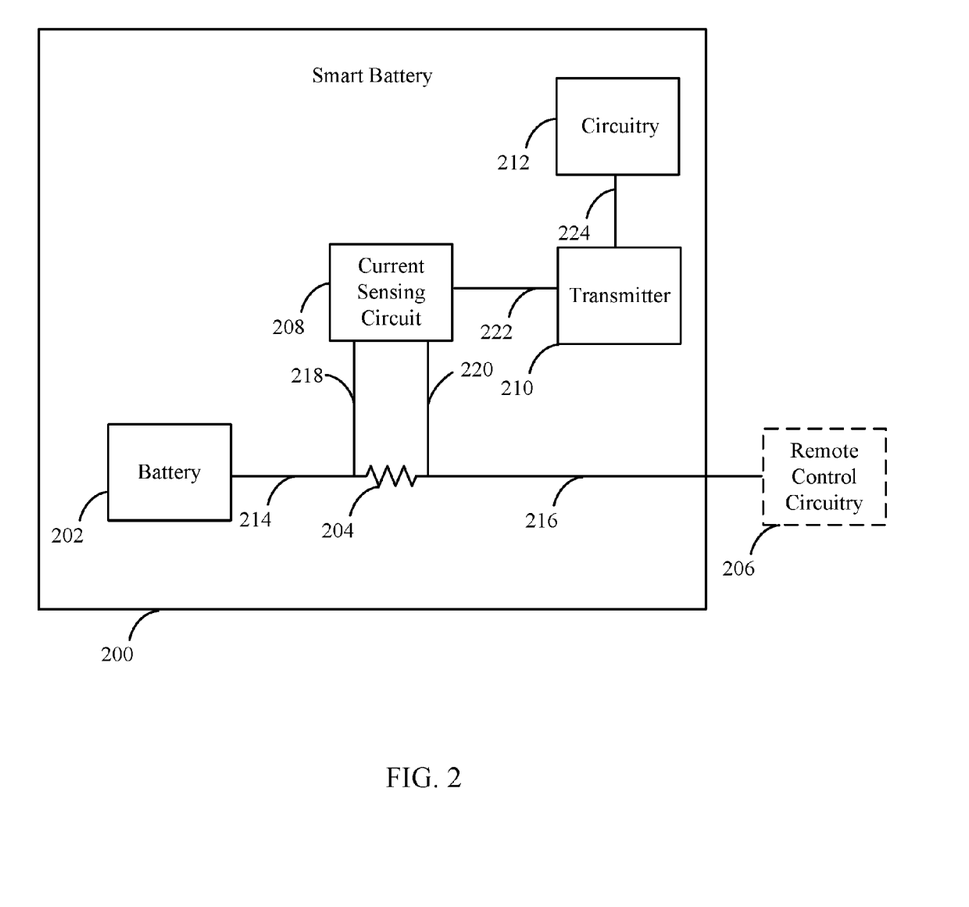
FIG. 2 is a block diagram of a smart battery in accordance with a first example embodiment.

FIG. 2 is a block diagram of a smart battery 200 in accordance with an example embodiment. Smart battery 200 may be an example of smart battery 108, as described above in reference to FIG. 1. As shown in FIG. 2, smart battery 200 is coupled with remote control circuitry 206 via connection 216. Remote control circuitry 206 is a component of the remote control device that is associated or paired with smart battery 200, for example, remote control device 102 shown in FIG. 1. Smart battery 200 includes a battery 202, a resistor 204 as a current sensing device, a current sensing circuit 208, a transmitter 210 and circuitry 212, each of which will be further described below.

Battery 202 is configured to provide power to the remote control device associated with smart battery 200. For example, when an end user interacts with an interface element of the remote control device (e.g., presses the volume up button), current is drawn from battery 202 to remote control circuitry 206. Current 214 flows from battery 202 through resistor 204, and current 216 flows from resistor 204 to remote control circuitry 206. When the end user is not interacting with the remote control device, it is in an idle state that draws little or no current from battery 202. When the end user is interacting with the remote control device (e.g., presses the power button), the remote control device is in an active state that draws some amount of current from battery 202, and the amount drawn may depend on the particular interface element being activated.

Resistor 204 is configured to be a sensing device, and may be an example of sensing device 110, as described above in reference to FIG. 1. Resistor 204 serves as a mechanism to measure a variation in current flow of battery 202 between the idle state and the active state of the remote control device. Resistor 204 may be of any value, shape, or size, and may be customized or may be commercially available off-the-shelf.

Current sensing circuit 208 is configured to determine a voltage level based on variation in current flow. For example, the voltage difference across resistor 204 may be captured by current sensing circuit 208 via connection 218 and connection 220. For example, different voltage level patterns may represent different interface elements of the remote control device. Certain interface elements may cause more power to be consumed, and thereby result in different power level patterns, when interacted with than other interface elements.

For one remote control device, the interface elements may uniquely correspond to different voltage level patterns. In this case, it may be possible to identify the specific interface elements being interacted with. For example, one interface element may correspond to a rectangle wave with a first duty cycle (e.g., representing a first code of zeros and ones) and another interface element may correspond to a rectangle wave with a second duty cycle (e.g., representing a second code of zeros and ones) that is different from the first.

For another remote control device, the voltage level patterns may not be completely unique to each interface element of that remote control device, thereby it may be difficult to identify the specific interface element being interacted with. But even when a specific interface element of a remote control device cannot be uniquely identified, the usage of a particular remote control device may still be detected. Such information may be used to determine which electronic device is being remotely controlled by the remote control device and/or the state of the electronic device. In example embodiments, current sensing circuit 208 may determine other information, e.g., a power level pattern, an amount of power consumed, or information indicative of the measured variation in the current flow. Current sensing circuit 208 is configured to output information 222 (e.g., voltage level pattern or power level pattern) to transmitter 210.

Transmitter 210 is configured to wirelessly transmit information to a receiver, such as receiver 104 shown in FIG. 1, via known networks and/or protocols (e.g., Bluetooth™, NFC, Wi-Fi). The information transmitted may be any information based on variation in current flow, for example, current, voltage or power level patterns or other information. Transmitter 210 may include a micro-controller or a processor and/or memory to gather and assemble the information for transmitting to the receiver.

Circuitry 212 may be included in smart battery 200 in some embodiments. Circuitry 212 may include one or more sensor(s) or circuitry to provide information 224 to transmitter 210 that enables the detection of remote control usage. In one or more embodiments, circuitry 212 includes a device configured to obtain acceleration information that is used to detect movement of the remote control device. Such a device may be, for example, an accelerometer, a magnetic sensor, a gyroscope, and/or a vibration sensor. The acceleration information may be used to determine whether a user has picked up, is holding, and/or has placed the remote control device in a different location and/or a cardinal direction (e.g., North or South) of the remote control device. This acceleration information may be provided to transmitter 210 to be transmitted to the receiver in addition to or in place of any information obtained from current sensing circuit 208. It is noted that such embodiments may be used, in lieu of or in conjunction, with any of the embodiments described above for determining whether a particular remote control device and/or interface element(s) thereof are being used.

In embodiments, certain components of smart battery 200 may be located externally thereto (e.g., in or attached to the remote control device). For example, transmitter 210 and/or circuitry 212 may be placed on a tag or patch that could be adhered to a housing of the remote control device or elsewhere.

Smart battery 200 may be of different sizes (e.g., AA or AAA) and may be rechargeable. Furthermore, smart battery 200 may be paired with a remote control device such that the receiver may identify the remote control device and/or its corresponding electronic device by a unique identifier (ID) associated with smart battery 200. Such unique ID may be randomly generated or predetermined at the time of manufacturing and/or during setup and/or pairing of smart battery 200 with the remote control device. For example, an end user may associate the unique ID of smart battery 200 with the remote control device in which smart battery 200 is inserted during a setup process. When an interface element of the remote control device is interacted with, transmitter 210 may transmit the unique ID and some identification information for the paired remote control device to the receiver. Thus, the unique ID enables the receiver to identify the remote control device and to detect its usage with or without other information.

C. Smart Battery Having a Magnetic Sensor as a Sensing Device

Figure 3:
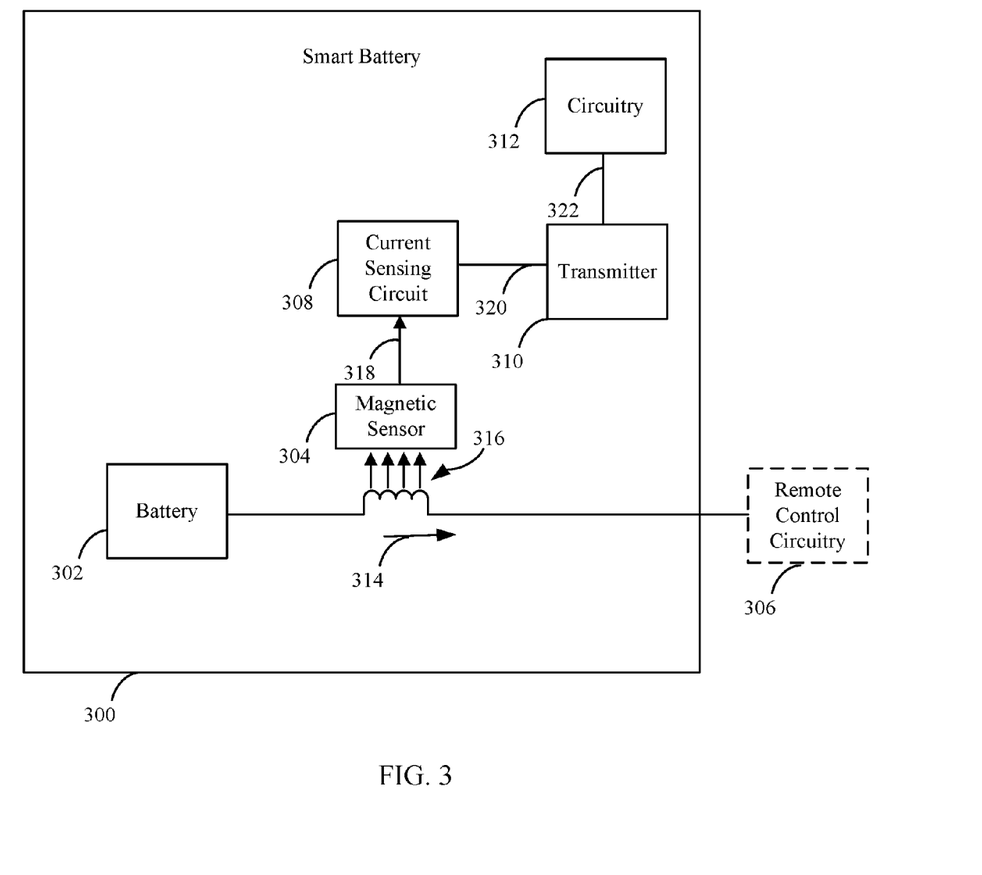
FIG. 3 is a block diagram of a smart battery in accordance with a second example embodiment.

FIG. 3 is a block diagram of a smart battery 300 in accordance with an example embodiment. Smart battery 300 may be an example of smart battery 108, as described above in reference to FIG. 1. Smart battery 300 includes a battery 302, a magnetic sensor 304 as a current sensing device, a current sensing circuit 308, a transmitter 310 and circuitry 312. Smart battery 300 is substantially similar to smart battery 200 shown in FIG. 2 with the following differences. Smart battery 300 has magnetic sensor 304 rather than a resistor that serves as a sensing device. Therefore, current sensing circuit 308 may be different from current sensing circuit 200 to accommodate the difference in the sensing device. However, many of the components of smart battery 300 are similar if not identical to those of smart battery 200, and therefore they may not be described in detail again for the sake of brevity.

As shown in FIG. 3, smart battery 300 is coupled with remote control circuitry 306. Remote control circuitry 306 is a component of the remote control device that is associated or paired with smart battery 300. An example of such a remote control device is remote control device 102 shown in FIG. 1.

Battery 302 is configured to provide power to the remote control device associated with smart battery 300. For example, when an end user interacts with an interface element of the remote control device (e.g., changing the channel on the TV), current is drawn from battery 302 to remote control circuitry 306. When the end user is not interacting with the remote control device, it is in an idle state that draws little or no current from battery 302. When the end user is interacting with the remote control device (e.g., presses the power button), the remote control device is in an active state that draws current from battery 302, and the amount of current drawn may depend on the particular interface element being activated.

Magnetic sensor 304 is configured to be a sensing device, and may be an example of sensing device 110, as described above in reference to FIG. 1. Magnetic sensor 304 serves as a mechanism to measure a variation in current flow of battery 302 between the idle state and the active state of the remote control device. Magnetic sensor 304 is configured to detect changes in a magnetic field that surrounds an electric current like flux, strength and direction, and the collected data may be used to determine and/or monitor rotation, angles, direction and presence of the electric current. As shown in FIG. 3, magnetic sensor 304 is configured to detect variations in magnetic field 316 from current 314 and convert the variations in the magnetic field into an electrical signal 318 (e.g., voltage level). Magnetic sensor 304 may be of any type and/or components (e.g., semiconductor sensors, Hall effect sensors, magnets, magnetic products), and may be customized or may be commercially available off-the-shelf.

Current sensing circuit 308 is configured to determine a voltage level based on variation in current flow as detected by magnetic sensor 304 and provided to current sensing circuit 308 as electrical signal 318. For example, different voltage level patterns may represent different interface elements of the remote control device. For a remote control device where different interface elements uniquely correspond to different voltage level patterns, it may be possible to identify the specific interface elements being interacted with. For example, one interface element may correspond to a rectangle wave with a first duty cycle (e.g., representing a first code of zeros and ones) and another interface element may correspond to a rectangle wave with a second duty cycle (e.g., representing a second code of zeros and ones) that is different from the first. For another remote control device, the voltage level patterns may not be completely unique to each interface element of that remote control device, thereby it may be difficult to identify the specific interface element being interacted with. But even when a specific interface element of a remote control device cannot be identified, the usage of a particular remote control device may still be detected. Remote control device usage information may be used to determine which electronic device is being remotely controlled by the remote control device and/or the state of the electronic device. In example embodiments, current sensing circuit 308 may determine other information, e.g., a power level pattern, an amount of power consumed, or information indicative of the measured variation in the current flow. Current sensing circuit 308 is configured to output information 320 (e.g., voltage level pattern or power level pattern) to transmitter 310.

Transmitter 310 is configured to wirelessly transmit information to a receiver, such as receiver 104 shown in FIG. 1, via known networks and/or protocols (e.g., Bluetooth™, NFC, Wi-Fi). The information transmitted may be any information based on variation in current flow, for example, current, voltage or power level patterns or power consumption information. Transmitter 310 may include a microcontroller or a processor and/or memory configured to render the information into a form suitable for transmission to the receiver.

Circuitry 312 may be included in smart battery 300 in some embodiments. Circuitry 312 may include one or more sensor(s) or circuitry to provide information 322 to transmitter 310 that enables the detection of remote control usage. In one or more embodiments, circuitry 312 includes a device configured to obtain acceleration information that is used to detect movement of the remote control device. Such a device may be, for example, an accelerometer, a magnetic sensor, a gyroscope, and/or a vibration sensor. Thus, the acceleration information may be used to determine whether a user has picked up, is holding, and/or has placed the remote control device in a different location and/or a cardinal direction (e.g., North or South) of the remote control device. This acceleration information may be provided to transmitter 310 to be transmitted to the receiver in addition to or in place of any information obtained from current sensing circuit 308. It is noted that such embodiments may be used, in lieu of or in conjunction, with any of the embodiments described above for determining whether a particular remote control device and/or interface element(s) thereof are being used.

In embodiments, certain components of smart battery 300 may be located externally thereto (e.g., in or attached to the remote control device). For example, transmitter 310 and/or circuitry 312 may be placed on a tag or patch that could be adhered to a housing of the remote control device or elsewhere.

Smart battery 300 may be of different sizes (e.g., AA or AAA) and may be rechargeable. Furthermore, smart battery 300 may be paired with a remote control device such that the receiver may identify the remote control device and/or its corresponding electronic device by a unique identifier (ID) associated with smart battery 300. Such unique ID may be randomly generated or predetermined at the time of manufacturing and/or during setup and/or pairing of smart battery 300 with the remote control device. When an interface element of the remote control device is interacted with, transmitter 310 may transmit the unique ID and some identification information for the paired remote control device to the receiver. Thus, the unique ID enables the receiver to identify the remote control device and to detect its usage.

D. Receiver

Figure 4:
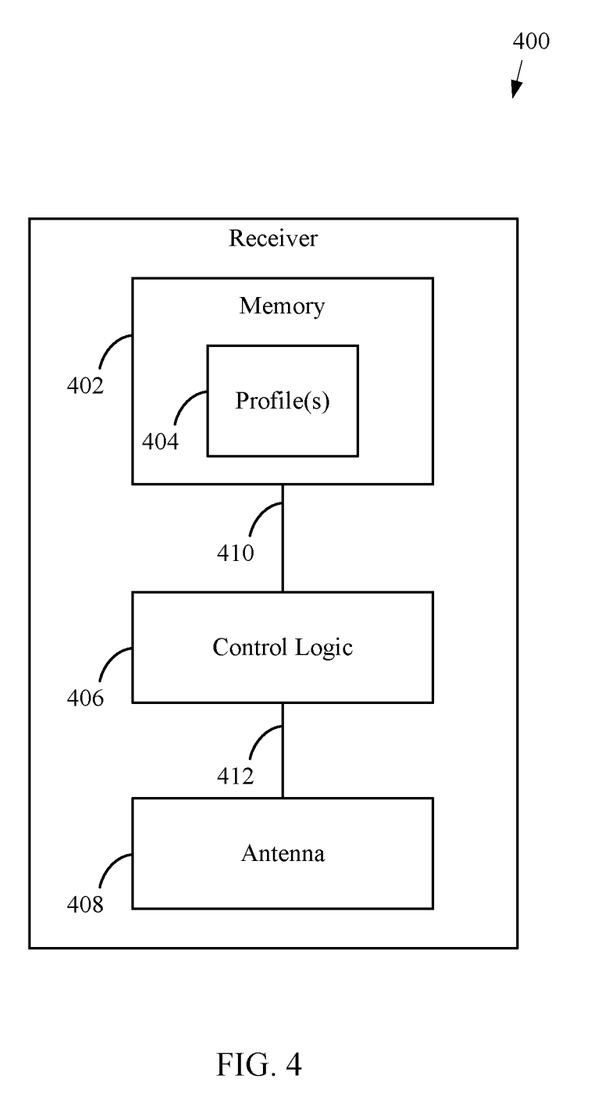
FIG. 4 is a block diagram of a receiver in accordance with an example embodiment.

FIG. 4 is a block diagram of a receiver 400 in accordance with an example embodiment. Receiver 400 may be an example of receiver 104, as described above in reference to FIG. 1. Receiver 400 is configured to receive information transmitted by a smart battery, such as smart battery 108 that is inserted in remote control device 102 shown in FIG. 1. Receiver 400 includes memory 402 for storing one or more profile(s) 404, control logic 406, and antenna 408, each of which will be further described below.

Antenna 408 is configured to wirelessly receive data, such as information 118 shown in FIG. 1, from the smart battery and to provide the information to control logic 406 via connection 412. Antenna 408 may be omnidirectional or directional and is configured to detect the presence of radio waves. Antenna 408 may be of any shape or size, and may be implemented by part(s) that are customized or may be commercially available off-the-shelf. The received information may include a voltage level or information based on the voltage level, such as power consumption information.

Memory 402 is configured to store data, for example, one or more profile(s) 404, and to provide data to control logic 406 via connection 410. Memory 402 may be any type of storage devices, such as hard disk drives, removable storage devices, memory cards, or memory sticks. Profiles 404 may comprise a plurality of power pattern profiles for a plurality of different remote control devices and/or interface elements for each of the different remote control devices. Each of profiles 404 is associated with one or more identifiers that indicate the remote control device and/or an interface element thereof associated with the profile. Profiles 404 may be modified, deleted or added to memory 402 in various manners, e.g., at the time of manufacturing or at any other point in the life cycle of receiver with data obtained or downloaded from one or more servers, data centers, and/or cloud-based storages. The data obtained enables old data to be fine-tuned or corrected as well as enables new profiles for new remotes to be added. Memory 402 may also store data about the electronic devices and/or the smart batteries (e.g., their unique IDs) that may be associated with each remote control device.

In example embodiments, the information received at receiver 400 includes current information (e.g., variation in current flow from a battery) associated with a particular key press or interface element of the remote control device or any information based on the current information (e.g., voltage level patterns, power level patterns). Control logic 406 is configured to process (e.g., parse, convert, decrypt) the received information into one or more format(s). Control logic 406 is further configured to obtain profiles 404 from memory 402 via connection 410, and to compare profiles 404 to the received information. For example, control logic 406 may compare a power level pattern received from the smart battery to one or more profiles 404 to determine whether there is a match. If a match is found, control logic 406 identifies (using the identifier(s)) the remote control device and/or the interface element of the remote control device that was interacted with by the end user. For example, a power level pattern that may be represented by a particular code (e.g., a series of zeros and ones (1001 or 1101)) may correspond to a power button press. If no match is found for the power level pattern, control logic 406 may still identify the remote control device that was used by the end user through other means. For example, control logic 406 may utilize the unique ID associated with the smart battery that is paired with a remote control device to identify the remote control device. Such unique ID may be transmitted to receiver 400 along with other information or in lieu of other information. Control logic 406 may be implemented in hardware (e.g., digital and/or analog circuits) or hardware and software (e.g., software or firmware running on a processor circuit or other hardware)

In an embodiment, control logic 406 is configured to identify remote control device usage using other information transmitted from the smart battery, for example, acceleration information that is indicative of the movement of the remote control device. For example, by using the acceleration information, control logic 406 may be able to determine whether an end user has picked up, is holding and/or placed the remote control device in a location different from the original location.

Receiver 400 may be integrated in another device, for example, a switching device (e.g., an audio/video receiver), a remote control device, or a device that may be used as a remote control for an electronic device.

In an embodiment, receiver 400 is a component of a switching device. Such a switching device may include a plurality of audio/video (AV) ports. The switching device may further include a switch circuit that is operable to selectively connect any one of a plurality of source devices, each of which is connected to a corresponding one of the plurality of AV ports, to a sink device that is connected to another one of the plurality of AV. Electronic devices that are configured to provide audio and/or video signals for playback are "source" devices, such as a Blu-ray player, a set-top box, or a streaming media device (e.g., Roku™, AppleTV™, Chromecast™). Electronic devices that are configured to receive audio and/or video signals are "sink" devices, such as a television (TV), or a sound system. AV ports may be high definition media interface (HDMI) ports, and the switching device may be referred to as an HDMI switch. The switching device is configured to switch between different AV source devices and provide an output signal from the selected AV source device without requiring the end user to physically connect/disconnect electronic devices from the AV ports. To provide automatic and seamless switching and/or control, the switching device, via receiver 400, may obtain information from the connected electronic devices to provide an enhanced and frustration-free experience to the end user. For example, when the end user uses a proprietary remote control (e.g., Roku™) to turn on a TV, receiver 400 may detect the usage of the proprietary remote control via the smart battery inserted in that proprietary remote control using the techniques described herein. In this manner, the usage of the proprietary remote control may be detected without having to identify and analyze IR signals and/or RF signals from the proprietary remote control.

In the above embodiment where receiver 400 is implemented in an HDMI switch, control logic 406 may identify the remote control device and/or the interface element(s) that has been interacted with by the end user. Based on such identification, control logic 406 may facilitate and/or automatically activate/switch to an input port to which a consumer electronic device associated with the identified remote control device is coupled.

The various states of consumer electronic devices may also be monitored by control logic 406 to determine whether the states have been changed and whether any action needs to be performed in response the change in state. In addition, control logic 406 may also effect a change in the states of the consumer electronic devices. In other words, the switching device may facilitate control operations (e.g., play, pause, stop) and/or change settings (e.g., volume control, brightness control) of the connected electronic devices based on their states. For example, if the end user powers off a game console connected to the switching device, the next time the user presses a button on the remote control of the game console, the switching device would know that the game console is powered off and needs to be powered back on. Based on this information, the switching device may cause the game console to be powered on in response to detecting usage of the remote control of the game console.

Furthermore, in an example embodiment, upon identifying the interface element of a remote control device that has been interacted with, a universal remote control device (which may be the same or different from the remote control device that was interacted with by the end user) may be automatically placed into a mode that enables the universal remote control device to communicate with the electronic device associated with the identified interface element and/or remote control device.

III. Methods

Figure 5:
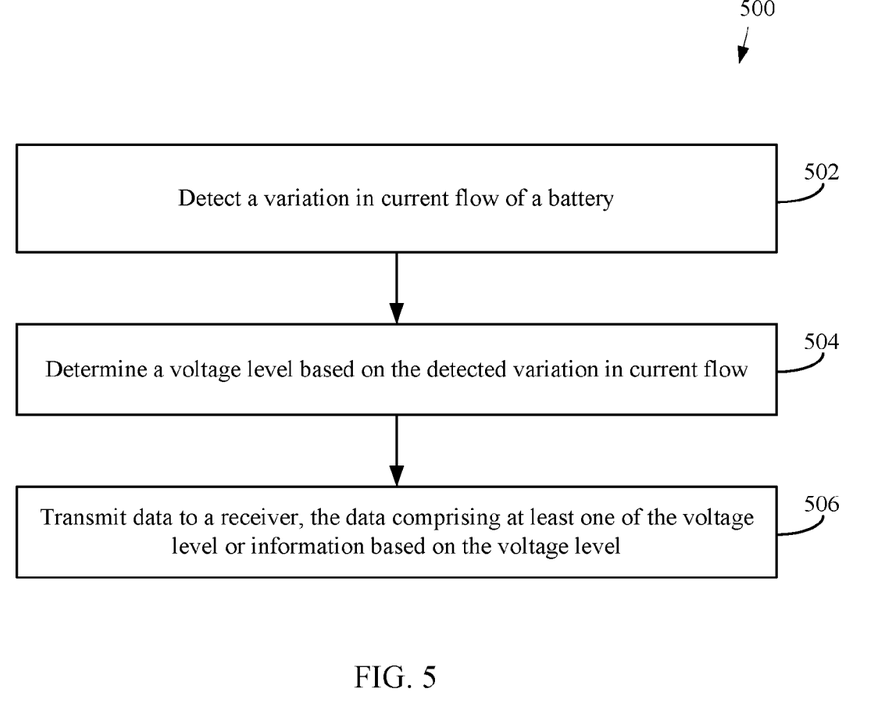
FIG. 5 shows a flowchart of a method for detecting usage of a remote control device in accordance with an example embodiment.

In embodiments, system 100, smart battery 200, smart battery 300, and receiver 400 may operate in various ways to facilitate the detection of remote control usage. For instance, FIG. 5 shows a flowchart 500 providing a process for detecting usage of a remote control device in accordance with an example embodiment. Flowchart 500 is described with respect to smart battery 200 and smart battery 300 for illustrative purposes. Further structural and operational embodiments will be apparent to persons skilled in the relevant art(s) based on the following description of flowchart 500.

Flowchart 500 begins with step 502. In step 502, a variation in current flow of a battery is detected. For example, with reference to FIG. 2, variation in current flow of battery 202 is detected using resistor 204. As another example, with reference to FIG. 3, variation in current flow of battery 302 is detected using magnetic sensor 304.

At step 504, a voltage level based on the detected variation in current flow is determined. For example, with reference to FIG. 2, the voltage level based on the detected variation in current flow is determined by current sensing circuit 208. As another example, with reference to FIG. 3, the voltage level based on the detected variation in current flow is determined by current sensing circuit 308.

At step 506, data is transmitted to a receiver, the data comprising at least one of the voltage level or information based on the voltage level. For example, with reference to FIG. 2, data (e.g., information 222 or information 224) is transmitted by transmitter 210 to a receiver, such as receiver 104 shown in FIG. 1 or receiver 400 shown in FIG. 4. As another example, with reference to FIG. 3, data (e.g., information 320 or information 322) is transmitted by transmitter 310 to a receiver, such as receiver 104 shown in FIG. 1 or receiver 400 shown in FIG. 4.

In some example embodiments, one or more of steps 502, 504, and/or 506 of flowchart 500 may not be performed. Moreover, operations in addition to or in lieu of steps 502, 504, and/or 506 may be performed. Further, in some example embodiments, one or more of steps 502, 504, and/or 506 may be performed out of order, in an alternate sequence, or partially (or completely) concurrently with each other or with other operations.

Figure 6:
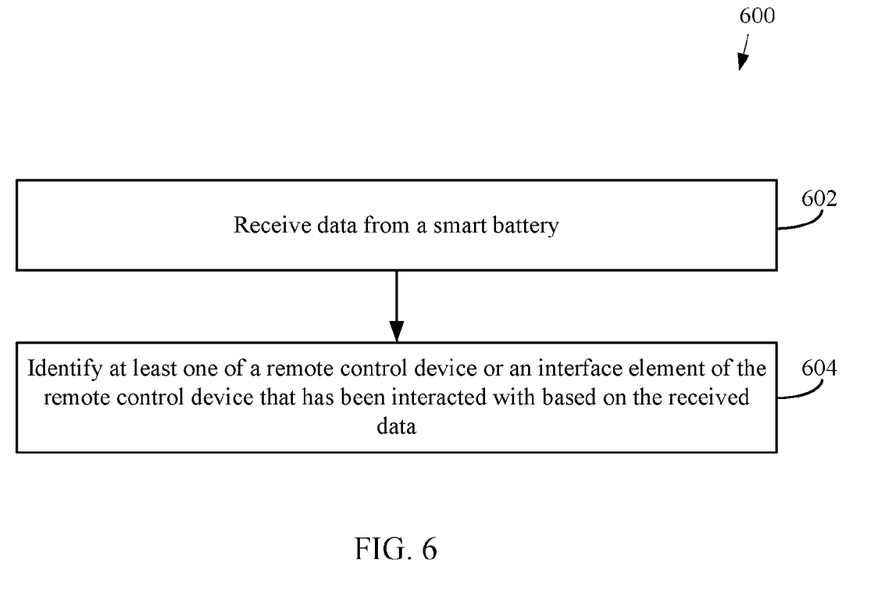
FIG. 6 shows a flowchart of a method for identifying a remote control device in use in accordance with an example embodiment.

FIG. 6 shows a flowchart 600 of a method for identifying a remote control device in use in accordance with another embodiment. Flowchart 600 is described with respect to receiver 400 for illustrative purposes. Further structural and operational embodiments will be apparent to persons skilled in the relevant art(s) based on the following description of flowchart 600.

Flowchart 600 begins with step 602. At step 602, data from a smart battery is received. For example, with reference to FIG. 4, receiver 400 may comprise an antenna that receives information from a smart battery. Such information may be a current, voltage, or power level pattern, an amount of power consumed, or information indicative of the measured variation in the current flow of the smart battery, as well as a unique ID of the smart battery or acceleration information.

At step 604, at least one of a remote control device or an interface element of the remote control device that has been interacted with based on the received data is identified. For example, with reference to FIG. 4, control logic 406 of receiver 400 compares the received information to the profile(s) stored in memory 402 to identify at least one of a remote control device and an interface element of the remote control device that has been interacted with. As another example, control logic 406 may identify at least a remote control device using a unique ID of the smart battery that is paired with that remote control device or using acceleration information transmitted from the smart battery.

Receiver 400 may also perform other steps. For example, receiver 400, when implemented in an HDMI switch, may determine a state of an electronic device associated with the remote control device that is in use. Receiver may also provide automatic switching and/or control of that electronic device. Receiver 400 may further facilitate automatic placement of a remote control device into a particular mode that enables the remote control device to communicate with a desired electronic device.

In some example embodiments, one or more of steps 602 and/or 604 of flowchart 600 may not be performed. Moreover, operations in addition to or in lieu of 602 and/or 604 may be performed. Further, in some example embodiments, one or more of 602 and/or 604 may be performed out of order, in an alternate sequence, or partially (or completely) concurrently with each other or with other operations.

IV. Example Computer System Implementation

A device, as defined herein, is a machine or manufacture as defined by 35 U.S.C. § 101. Devices may be digital, analog or a combination thereof. Devices may include integrated circuits (ICs), one or more processors (e.g., central processing units (CPUs), microprocessors, digital signal processors (DSPs), etc.) and/or may be implemented with any semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

Techniques and embodiments, including methods, described herein may be implemented in hardware (digital and/or analog) or a combination of hardware and software and/or firmware. Techniques described herein may be implemented in one or more components. Embodiments may comprise computer program products comprising logic (e.g., in the form of program code or instructions as well as firmware) stored on any computer useable storage medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable storage media include, but are not limited to, a hard disk, a removable magnetic disk, a removable optical disk, flash memory cards, digital video disks, random access memories (RAMs), read only memories (ROM), and the like. In greater detail, examples of such computer readable storage media include, but are not limited to, a hard disk associated with a hard disk drive, a removable magnetic disk, a removable optical disk (e.g., CDROMs, DVDs etc.), zip disks, tapes, magnetic storage devices, MEMS (microelectromechanical systems) storage, nanotechnology-based storage devices, as well as other media such as flash memory cards, digital video discs, RAM devices, ROM devices, and the like. Such computer-readable storage media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Computer readable storage media are distinguished from and non-overlapping with communication media. Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wired media as well as wireless media such as acoustic, RF, infrared and other wireless media.

The remote control device usage detection system embodiments and/or any further systems, subsystems, and/or components disclosed herein may be implemented in hardware (e.g., hardware logic/electrical circuitry), or any combination of hardware with software (computer program code configured to be executed in one or more processors or processing devices) and/or firmware.

Figure 7:
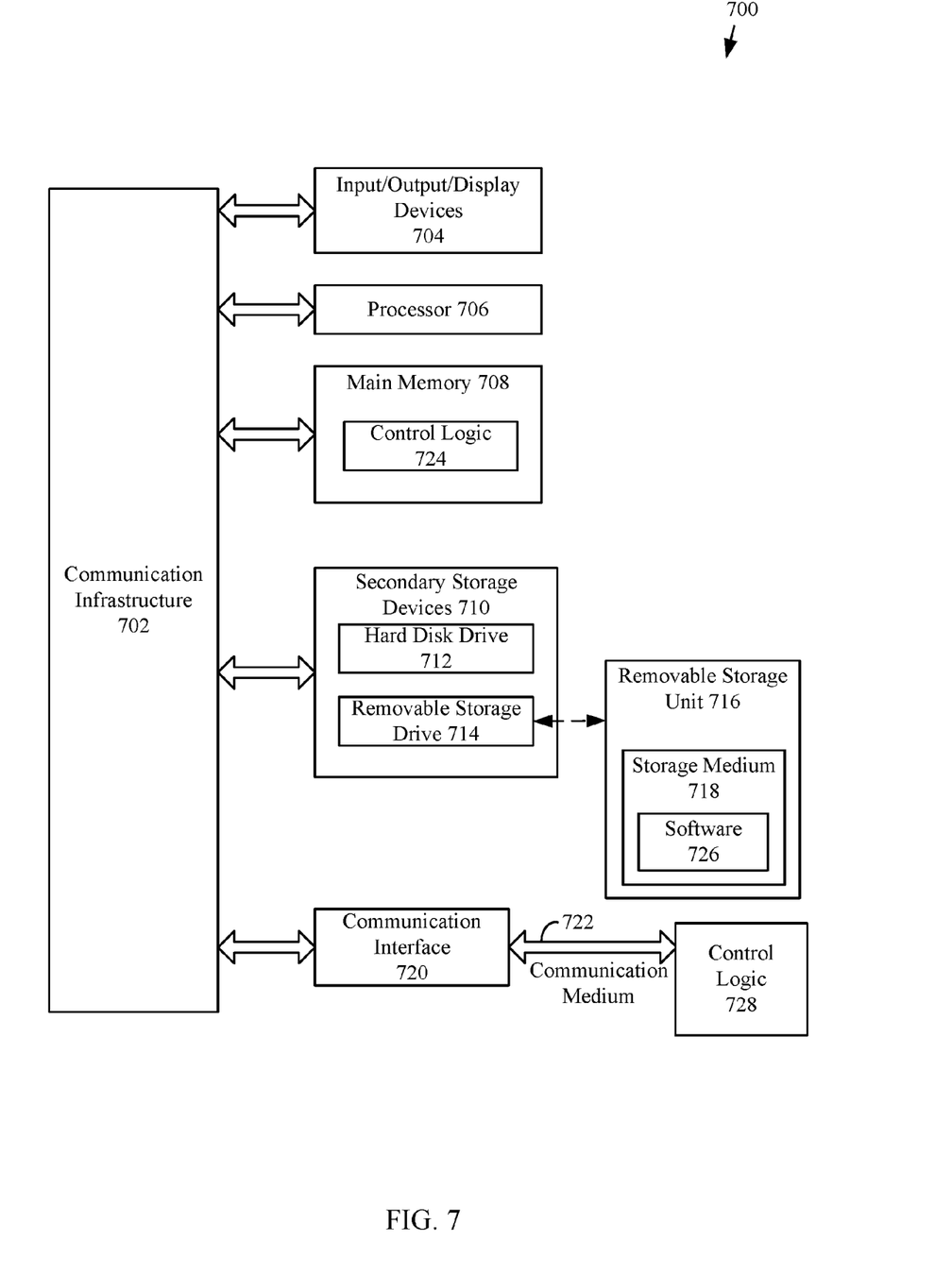
FIG. 7 is a block diagram of an example computer system in which embodiments may be implemented.

The embodiments described herein, including systems, methods/processes, and/or apparatuses, may be implemented using well known servers/computers, such as computer 700 shown in FIG. 7. For example, smart battery 108, receiver 104, smart battery 200, smart battery 300, receiver 400, any of the sub-systems, components or sub-components respectively contained therein, flowchart 500 and flowchart 600, may each be implemented using one or more computers 700.

Computer 700 can be any commercially available and well-known computer capable of performing the functions described herein, such as computers available from International Business Machines, Apple, Sun, Dell, Gray, etc. Computer 700 may be any type of computer, including a desktop computer, a server, etc.

As shown in FIG. 7, computer 700 includes one or more processors (also called central processing units, or CPUs), such as a processor 706. Processor 706 may be used to implement certain elements of the system infrastructures shown in FIGS. 1-6; or any portion or combination thereof, for example, though the scope of the embodiments is not limited in this respect. Processor 706 is connected to a communication infrastructure 720, such as a communication bus. In some embodiments, processor 706 can simultaneously operate multiple computing threads.

Computer 700 also includes a primary or main memory 708, such as random access memory (RAM). Main memory 708 has stored therein control logic 724 (computer software), and data.

Computer 700 further includes one or more secondary storage devices 710. Secondary storage devices 710 may include, for example, a hard disk drive 712 and/or a removable storage device or drive 714, as well as other types of storage devices, such as memory cards and memory sticks. For instance, computer 700 may include an industry standard interface, such a universal serial bus (USB) interface for interfacing with devices such as a memory stick. Removable storage drive 714 may represent a floppy disk drive, a magnetic tape drive, a compact disk drive, an optical storage device, tape backup, etc.

Removable storage drive 714 may interact with a removable storage unit 716. Removable storage unit 716 includes a computer useable or readable storage medium 718 having stored therein computer software 726 (control logic) and/or data. Removable storage unit 716 represents a floppy disk, magnetic tape, compact disc (CD), digital versatile disc (DVD), Blu-Ray™ disc, optical storage disk, memory stick, memory card, or any other computer data storage device. Removable storage drive 714 reads from and/or writes to removable storage unit 716 in a well-known manner.

Computer 700 also includes input/output/display devices 704, such as monitors, keyboards, pointing devices, etc.

Computer 700 further includes a communication or network interface 720. Communication interface 720 enables computer 700 to communicate with remote devices. For example, communication interface 720 allows computer 700 to communicate over communication networks or mediums 722 (representing a form of a computer useable or readable medium), such as local area networks (LANs), wide area networks (WANs), the Internet, etc. Communication interface 720 may interface with remote sites or networks via wired or wireless connections. Examples of communication interface 722 include but are not limited to a modem, a network interface card (e.g., an Ethernet card), a communication port, a Personal Computer Memory Card International Association (PCMCIA) card, etc.

Control logic 728 may be transmitted to and from computer 700 via the communication medium 722.

Any apparatus or manufacture comprising a computer useable or readable medium having control logic (software) stored therein is referred to herein as a computer program product or program storage device. This includes, but is not limited to, computer 700, main memory 708, secondary storage devices 710, and removable storage unit 716. Such computer program products, having control logic stored therein that, when executed by one or more data processing devices, cause such data processing devices to operate as described herein, represent embodiments of the invention.

V. Conclusion

In accordance with an embodiment, any combination of the above-described embodiments may be utilized depending on the system being implemented.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A receiver, comprising:
an antenna configured to receive data from a smart battery, the received data comprising at least one of a voltage level or information based on the voltage level; and
control logic that is configured to:
compare the received data with a plurality of profiles, each of the profiles being associated with a different remote control device or a different interface element of a remote control device, and
based on an identification of a match between the received data and one of the profiles in the plurality of profiles, identify at least one of a remote control device that is paired with the smart battery or an interface element of the remote control device that has been interacted with.

2. The receiver of claim 1, further comprising:
a memory configured to store the plurality of profiles.

3. The receiver of claim 2, wherein the memory is further configured to obtain profile data from one or more sources, wherein the obtained profile data facilitates one or more of:
a modification of one or more profiles of the plurality of profiles;
a deletion of one or more profiles of the plurality of profiles; and
an addition to the plurality of profiles.

4. The receiver of claim 1, wherein the received data further comprises acceleration information regarding movement of the paired remote control.

5. The receiver of claim 1, wherein the control logic is further configured to determine a state of a device that was remotely controlled by the identified remote control device.

6. The receiver of claim 1, wherein the control logic is further configured to effect a change to a state of a device that was remotely controlled by the identified remote control device based on the interface element of the remote control device that has been interacted with.

7. A method in a receiver, comprising:
receiving data from a smart battery, the received data comprising at least one of a voltage level or information based on the voltage level;
comparing the received data with a plurality of profiles, each of the profiles being associated with a different remote control device or a different interface element of a remote control device; and
based on an identification of a match between the received data and one of the profiles in the plurality of profiles, identifying at least one of a remote control device that is paired with the smart battery or an interface element of the remote control device that has been interacted with.

8. The method of claim 7, further comprising:
storing the plurality of profiles.

9. The method of claim 8, further comprising:
obtaining profile data from one or more sources, wherein the obtained profile data facilitates one or more of:
a modification of one or more profiles of the plurality of profiles;
a deletion of one or more profiles of the plurality of profiles; and
an addition to the plurality of profiles.

10. The method of claim 7, wherein the received data further comprises acceleration information regarding movement of the paired remote control.

11. The method of claim 7, further comprising:
determining a state of a device that was remotely controlled by the identified remote control device.

12. The method of claim 7, further comprising:
effecting a change to a state of a device that was remotely controlled by the identified remote control device based on the interface element of the remote control device that has been interacted with.

* * * * *